(12) United States Patent
Law et al.

(10) Patent No.: US 11,739,434 B2
(45) Date of Patent: Aug. 29, 2023

(54) PLATING SYSTEMS HAVING REDUCED AIR ENTRAINMENT

(71) Applicant: Applied Materials, Inc., Santa Clara, CA (US)

(72) Inventors: Cameron Law, Kalispell, MT (US); Daniel Durado, Kalispell, MT (US); Thomas Oberlitner, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 32 days.

(21) Appl. No.: 16/739,569

(22) Filed: Jan. 10, 2020

(65) Prior Publication Data
US 2020/0152467 A1    May 14, 2020

Related U.S. Application Data

(63) Continuation of application No. PCT/US2018/041463, filed on Jul. 10, 2018.
(Continued)

(51) Int. Cl.
    *C25D 17/02*    (2006.01)
    *C25D 7/12*    (2006.01)
    (Continued)

(52) U.S. Cl.
    CPC .............. *C25D 17/02* (2013.01); *C25D 7/12* (2013.01); *C25D 17/04* (2013.01); *C25D 21/10* (2013.01);
    (Continued)

(58) Field of Classification Search
    None
    See application file for complete search history.

(56) References Cited

U.S. PATENT DOCUMENTS 6,713,122 B1    3/2004    Mayer et al.
7,857,958 B2    12/2010    Mchugh et al.
(Continued)

FOREIGN PATENT DOCUMENTS

JP    H06-224202 A    8/1994
JP    H07-106294 A    4/1995
(Continued)

OTHER PUBLICATIONS

International Search Report and Written Opinion dated Oct. 31, 2018 in International Patent Application No. PCT/US2018/041463, all pages.
(Continued)

*Primary Examiner* — Louis J Rufo
(74) *Attorney, Agent, or Firm* — Kilpatrick Townsend & Stockton LLP

(57) ABSTRACT

Electroplating processing systems according to the present technology may include a recirculating tank containing a first volume of processing fluid. The recirculating tank may be fluidly coupled with a delivery pump. The systems may include a vessel configured to receive the processing fluid from the pump. The vessel may include an inner chamber and an outer chamber, and the inner chamber may be sized to hold a second volume of processing fluid less than the first volume of processing fluid. A liquid level sensor may be associated with the vessel to provide a liquid level indication in the outer chamber. The systems may include a return line coupled with an outlet of the vessel and coupled with an inlet of the recirculating tank. The systems may also include a return pump fluidly coupled with the return line. The return pump may be electrically coupled with the liquid level sensor.

14 Claims, 3 Drawing Sheets

Related U.S. Application Data

(60) Provisional application No. 62/530,721, filed on Jul. 10, 2017.

(51) Int. Cl.

| | |
|---|---|
| *H01L 21/288* | (2006.01) |
| *H01L 21/67* | (2006.01) |
| *H01L 21/768* | (2006.01) |
| *C25D 17/04* | (2006.01) |
| *C25D 21/10* | (2006.01) |
| *C25D 17/00* | (2006.01) |
| *C25D 21/12* | (2006.01) |

(52) U.S. Cl.
CPC ........ *H01L 21/288* (2013.01); *H01L 21/6723* (2013.01); *H01L 21/76873* (2013.01); *C25D 17/001* (2013.01); *C25D 21/12* (2013.01)

(56) References Cited

U.S. PATENT DOCUMENTS

| | | | |
|---|---|---|---|
| 9,222,188 B2 | 12/2015 | Commander et al. | |
| 2004/0182712 A1 | 9/2004 | Basol | |
| 2006/0191784 A1 | 8/2006 | Hitzfeld et al. | |
| 2010/0024724 A1 | 2/2010 | Hartz et al. | |
| 2011/0056840 A1* | 3/2011 | Isono .................. | C25D 21/10 205/296 |
| 2012/0138471 A1* | 6/2012 | Mayer .................. | C25D 21/12 205/170 |
| 2014/0166476 A1* | 6/2014 | Abraham ............. | C25D 21/12 204/237 |
| 2017/0167045 A1 | 6/2017 | Abraham et al. | |

FOREIGN PATENT DOCUMENTS

| | | | | |
|---|---|---|---|---|
| JP | 2002-363788 A | 12/2002 | | |
| KR | 2015-0052801 A | 5/2015 | | |
| WO | WO-0023639 A1 * | 4/2000 | ............. | C25D 21/20 |

OTHER PUBLICATIONS

International Preliminary Report on Patentability dated Jan. 14, 2020 in International Patent Application No. PCT/US2018/041463, all pages.

Grundfos, Pump Handbook, Jan. 2, 2015, pp. 112 to 116 and 18.

* cited by examiner

PLATING SYSTEMS HAVING REDUCED AIR ENTRAINMENT

CROSS-REFERENCES TO RELATED APPLICATIONS

This application is a continuation of International Patent Application No. PCT/US2018/041463, filed on Jul. 10, 2018, which claims priority to U.S. Provisional Patent Application No. 62/530,721, filed on Jul. 10, 2017, both of which are hereby incorporated by reference in their entirety for all purposes.

TECHNICAL FIELD

The present technology relates to semiconductor methods and equipment. More specifically, the present technology relates to processing systems configured to reduce air entrainment in processing fluids used in semiconductor fabrication.

BACKGROUND

Semiconductor devices are generally formed by producing intricate structures on a substrate or workpiece. Fabrication often includes formation of conductive lines or metallization that deposits or forms metal-containing materials in trenches and vias through the device to provide conductive pathways between layers and structures.

The metal layers are often formed on the substrates with electrochemical plating in an electroplating processor. A typical electroplating processor includes a vessel or bowl for holding an electroplating solution, one or more anodes in the bowl in contact with the electroplating solution, and a head having a contact ring with multiple electrical contacts that touch the wafer. A seal member may also be included about the head to maintain the bath solution away from the contacts. The front surface of the wafer may be immersed in the electroplating solution and an electrical field may cause metal ions in the electroplating solution to plate out onto the wafer, forming a metal-containing layer.

During processing, especially entry and removal of a wafer, volumetric changes may occur in the electroplating solution in the vessel. This may expose apertures in the vessel or may otherwise allow air to be entrained in the processing fluid. As this fluid is recirculated, the air may produce bubbles that may be delivered back into the vessel during processing. These bubbles may become lodged in features on a semiconductor substrate and may inhibit metallic deposition within trenches or features, which may cause shorting or failure in produced devices.

Thus, there is a need for improved systems and methods that can be used to produce high quality devices and structures. These and other needs are addressed by the present technology.

SUMMARY

Electroplating processing systems according to the present technology may include a recirculating tank containing a first volume of processing fluid. The recirculating tank may be fluidly coupled with a delivery pump. The systems may include a vessel configured to receive the processing fluid from the pump. The vessel may include an inner chamber and an outer chamber, and the inner chamber may be sized to hold a second volume of processing fluid less than the first volume of processing fluid. A liquid level sensor may be associated with the vessel to provide a liquid level indication in the outer chamber. The systems may include a return line coupled with an outlet of the vessel and coupled with an inlet of the recirculating tank. The systems may also include a return pump fluidly coupled with the return line. The return pump may be electrically coupled with the liquid level sensor.

In some embodiments, the return line may include a restriction sized to maintain a gravity-assisted fluid flow rate less than a steady-state delivery rate of the delivery pump. The return pump may be configured to disengage when the liquid level sensor indicates a fluid level in the outer chamber of the vessel at or below a predetermined minimum. The return pump may include an integral-level control algorithm to determine pump speed based on readings from the liquid level sensor. The return pump may be chemically compatible with at least one of methanesulfonic acid, potassium hydroxide, and boric acid. The return pump may be rated at less than or about 100 Watts. The vessel when containing the second volume of fluid may be positioned within the system at a fluid height differential from the recirculating tank of less than 24 inches.

The present technology also encompasses electroplating processing systems. The systems may include a recirculating tank. The systems may include a vessel configured to receive a processing fluid from the recirculating tank. The vessel may include an inner chamber and an outer chamber. The systems may include a return line positioned between an outlet of the vessel and an inlet of the recirculating tank. The systems may also include a container fluidly coupled with the return line. The container may be configured to receive processing fluid exiting the vessel. The container may include a media configured to extract entrained bubbles within the processing fluid.

In some embodiments, the media may be configured to extract bubbles characterized by a diameter of 1 μm or greater. The media may be chemically compatible with at least one of methanesulfonic acid, potassium hydroxide, or boric acid. The media may include a polymeric material. The polymeric material may be or include a mesh disposed within the container. The container may be coupled with at least two vessels.

The present technology also encompasses electroplating processing systems. The systems may include a recirculating tank. The systems may include a processing vessel configured to receive a processing fluid from the recirculating tank. The vessel may include an inner chamber and an outer chamber. The systems may include a return line positioned between an outlet of the vessel and an inlet of the recirculating tank. The systems may also include a buffer vessel fluidly coupled between the processing vessel and the recirculating tank. The buffer vessel may include a first exit port from the buffer vessel. The buffer vessel may include a standpipe coupled with a base of the buffer vessel. The standpipe may provide access to a second exit port from the buffer vessel.

In some embodiments, the buffer vessel may include a channel positioned within the buffer vessel and configured to deliver processing fluid down into the buffer vessel. The system may include a plurality of processing vessels configured to receive the processing fluid from the recirculating tank. The buffer vessel may be configured to receive processing fluid from each of the processing vessels of the plurality of processing vessels. The buffer vessel may include a plurality of standpipes. Each standpipe may extend from the base of the buffer vessel to a height different from each other standpipe of the plurality of standpipes. The standpipe may be characterized by a sloped surface of an interior edge at a top of the standpipe. The standpipe may be characterized by a port proximate the base of the buffer vessel. In some embodiments, a media configured to extract entrained bubbles within the processing fluid may be positioned within the standpipe or within the return line.

Such technology may provide numerous benefits over conventional technology. For example, the present devices may reduce air entrainment into the processing fluid. Additionally, the improved technology may further remove air that becomes entrained in the processing fluid. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
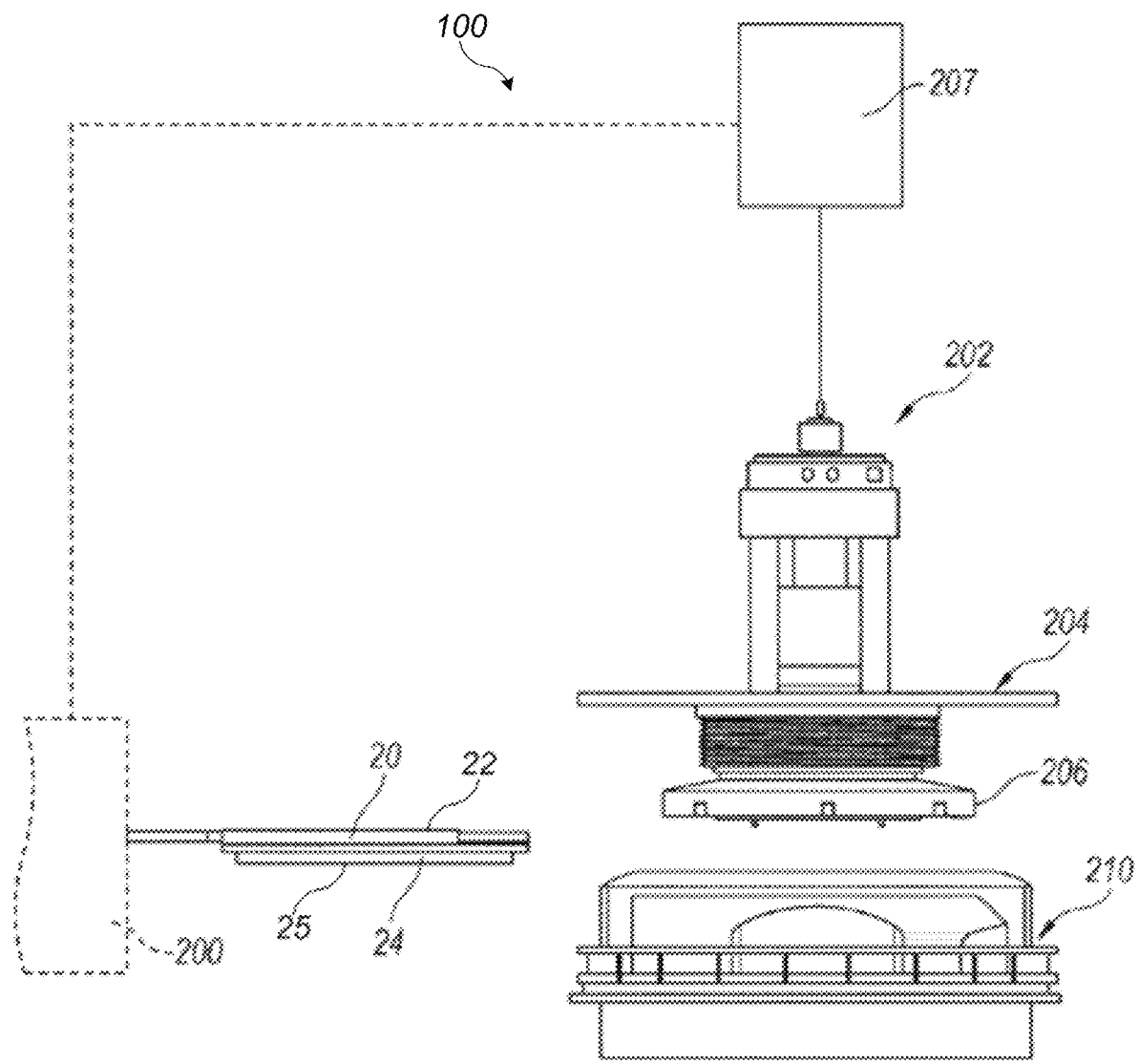
FIG. 1 shows a schematic view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Electroplating processes may be used to form conductive materials along and through various features of a semiconductor substrate. Many plating operations may deliver a substrate into a plating bath to electrochemically deposit metal on the substrate. The plating bath may include a number of metal ions that are electrically activated by the electroplating device to form or deposit on the substrate. The plating bath fluid or processing fluid may be circulated through the system and re-delivered into the system. This circulation may include filtration, re-balancing of ions, temperature adjustment, and other processing. In many processing systems, the return path from the vessel is generated by gravity-assisted flow, which is based on the fluid height differential between the vessel and the recirculating tank. As many systems are compact, this head pressure may be limited to twelve inches or less of head space. Plating processes may occur in an ambient environment, and air entrainment into the processing fluid may cause issues as previously noted. Entry and removal of the substrate may cause relatively large volume changes in processing fluid movement within the vessel. Flow adjustment and control from the vessel may not occur rapidly enough to limit air entrainment, which may allow air to be pulled into the processing fluid.

Conventional technologies may address this issue by using valves and sensors to control the level of fluid in the vessel in an attempt limit air bubbles. The systems may also include debubblers in the delivery line to remove air incorporated within the processing fluid. However, many of these designs are insufficient. For example, valves may allow adjustment to flow in and out of the vessel, however they are still limited to a maximum rate when the valve is open based on head pressure in the system. When a substrate is delivered into the vessel, the volume of fluid to be removed from displacement may be greater than can be quickly removed through the system with assisted gravity and piping, which may produce turbulence and air entrainment. Moreover, as tolerances continue to reduce, operation of a valve-based system may include almost constant directional change of the valve opening or closing, which can cause wear and failure of diaphragms in the valves.

The present technology overcomes these issues by utilizing one or more structures within the return path from the vessel to control liquid level and air entrainment. The present technology includes both active and passive systems for addressing liquid level and air entrainment, which may provide enhanced control over processing fluids being used. As the amount of air incorporated within the processing fluid is reduced with the present technology, defects and device failures may be further reduced over conventional technologies.

Although the remaining portions of the specification will routinely reference semiconductor processing, the present techniques should not be considered limited to semiconductors or specifically plating operations. For example, many technologies seek to control fluid delivery in small scale systems, such as microfluidics, medical fluid processing, and many other fields. The present systems and techniques may be suitable for these technologies as well, which may afford a more controlled fluid removal and delivery of fluid with less bubbling. After discussing an exemplary chamber in which the present technology may be used, a number of structures will be described to improve fluid delivery and air entrainment.

FIG. 1 shows a schematic view of an exemplary processing system 100 according to embodiments of the present technology. Processing system 100 may include some of the components which may be used in the technology discussed throughout the present disclosure. As illustrated, processing system 100 may include a substrate holder 20 used for electroplating a semiconductor substrate or wafer 25. The substrate holder 20 may include an annular member 24 and a backing plate assembly 22. The substrate holder 20 may be moved from a load/unload module to a processor 202 via the robot 200. The substrate holder 20 may be attached to the rotor 206 of the processor 202 via a hub engaging a fitting on the rotor. During processing, an electric current path may be provided from the processor 202, which may be a cathode in the processor, to the wafer 25 with a fitting to internal electrical contacts, a backing plate bus bar, chuck contacts, a ring bus bar, and to the electrical contact fingers that contact the wafer. The chuck contacts may make an electrical connection between the backing plate assembly 22 and a ring bus bar.

A processor head 204 of the processor 202 may move the wafer 25 held in the substrate holder 20 into a bath of electrolyte in vessel 210 of the processor 202 and may pass electrical current through the electrolyte to electroplate a metal or conductive film onto the wafer 25. After electroplating has been completed, this sequence of operations may be reversed. Lift pins in the load/unload module may extend up through lift pin clearance holes in the backing plate to allow the robot to pick up the plated wafer, and the plated wafer 25 may be removed from the electroplating system 100 for further processing. System control computer 207 may control delivery of the substrate into the vessel 210, and may control vertical translation, rotation, as well as angle of entry. FIG. 1 may illustrate a plating operation from the substrate side of a processing system.

Figure 2:
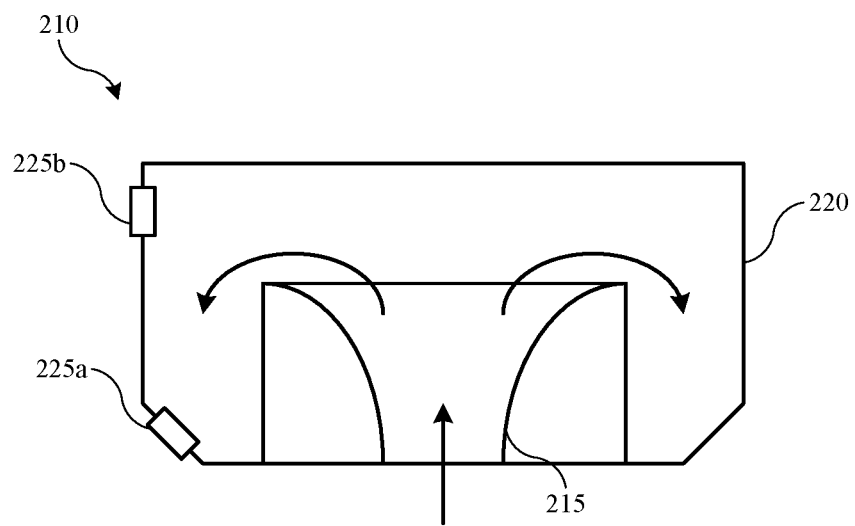
FIG. 2 shows a schematic cross-sectional view of an exemplary processing system vessel according to embodiments of the present technology.

Turning to FIG. 2 is shown a schematic cross-sectional view of an exemplary processing system vessel 210 according to embodiments of the present technology. Vessel 210 may receive a processing fluid, such as an electroplating fluid, that may be used to deposit metal or metal-containing materials on a substrate entered into the vessel 210. Vessel 210 may include an inner chamber 215 and an outer chamber 220. Processing fluid may be delivered into the inner chamber, such as from below as illustrated. The fluid may be delivered at a steady rate before, during, and/or after processing. In some embodiments, the rate may be adjusted during some operations, such as increasing the flow rate when a substrate has been removed from vessel 210, although in some embodiments the flow rate may be maintained constant during each aspect of the processing.

As the processing fluid fills the vessel and fills the volume of the inner chamber 215, the processing fluid may cascade over an outer edge of the inner chamber 215, and may flow into outer chamber 220. Inner chamber 215 may be sized to receive a substrate, such as a semiconductor substrate, which may be several hundred millimeters in diameter or more. A substrate coupled with a chuck as previously described may be delivered into inner chamber 215 for processing. The substrate may be provided so that an entire surface of the substrate is in contact with the processing fluid at any time. The outer chamber may be sized to accommodate a volume of processing fluid greater than or equal to the volume of the inner chamber.

During processing operations, the flow of processing fluids may be provided continuously to ensure the vessel is completely full of processing fluid at all times before and during processing. By providing a constant flow of processing fluid into and overflowing from inner chamber 215, the system may ensure that air gaps do not form between the processing fluid and the substrate, which may limit deposition on the substrate. Similarly, by flowing processing fluid up into the inner chamber 215, and allowing it to cascade from the inner vessel, air bubbles at the surface of the processing fluid in contact with the substrate may be limited or avoided. Once received by the outer chamber 220, processing fluid may be removed from the vessel 210, as will be discussed in more detail below. The processing fluid may exit the outer chamber 220 through a port, valve, gasket, or other delivery mechanism for removing processing fluid from the vessel 210.

Vessel 210 may also include one or more sensors for determining fluid level in the outer chamber 220. For example, liquid level sensor 225a or 225b may be positioned on or about vessel 210 and may provide one or more signals, such as feedback signals, of an amount of fluid within the outer chamber 220. This may be utilized to control a rate of removal of fluid from the outer chamber 220, to ensure fluid level neither floods the outer chamber, such as by extending above a zone of sensor 225b, nor does it fall below a minimum level within outer chamber 220, such as by falling below a zone of sensor 225a. For example, the outer chamber 220 may include a port through which fluid may be flowed or removed from outer chamber 220. Depending on a rate of removal from the chamber, a suction pressure may be developed at the port. If fluid were to fall to a level exposing the port, air would access the return system. Additionally, as fluid level extends towards the port, the suction pressure may cause a vortex effect, which may entrain air above the processing fluid into the fluid. Although visible bubbles may not be delivered through the return system, this amount of air may still pose issues within the processing system.

As semiconductor devices continue to shrink in size, features such as trenches and vias continue to reduce in size as well. This sizing may provide vias and trenches that may have widths or diameters that may be ten nanometers or less in size. Air entrained into the system may produce microscopic bubbles that may continue through the return system and recirculate back into the processing vessel. Bubbles of this scale may pass through filters and pumps, and these residual bubbles may cause plating issues on the substrate once returned back into the vessel. For example, a bubble of even one tenth of one micrometer that is entrained through the return system in the processing fluid and delivered back into the vessel may contact the substrate. Such a bubble may still be an order of magnitude larger than the diameter of a via or trench on a substrate, and may prevent plating from occurring within the via. This may remove a conductive path causing shorting or other defects on a substrate, which may then in the worst cases be scrapped as defective. Accordingly, even minute amounts of air within the system caused by imprecise fluid control within the vessel may cause an unacceptable amount of defects or issues with plating. Thus, as precision of plating requirements increase, ever more careful control of processing fluid levels within a system are necessary.

During processing, such as after the substrate has been delivered into the processing fluid in the vessel, such as into inner chamber 215, processing flow into and out of the vessel may be maintained at a steady-state condition. However, during delivery and removal of a substrate from the vessel, larger volumetric displacements of fluid may occur. For example, before a substrate is delivered into the vessel, the volume of the inner chamber 215 may be completely filled with processing fluid. When a substrate is delivered into the vessel, a surface on which plating is to be performed may be completely submerged in the processing fluid, which may displace an equivalent volume of processing fluid from the inner chamber 215 into the outer chamber 220. Accordingly, a rate of removal from the vessel 210 may be increased. Similarly, when a substrate is removed after processing, this volume is recovered, which may lower a volume of processing fluid in the inner chamber 215, which may reduce or halt flow into the outer chamber 220 for a period of time until the volume is recovered through fluid delivery into the vessel. If the rate of removal of processing fluid from the outer chamber is not reduced in a short enough time, the level within the outer chamber may drop sufficiently to allow air entrainment into the return flow, which may be delivered back into the vessel as microscopic bubbles that can cause plating defects.

The present technology includes multiple aspects for limiting air entrainment and handling bubble removal from the system, that will be described with each of the following figures. Although discussed individually, it is to be understood that any of the solutions described may be combined with one another or with other systems to provide more precise control of liquid level, as well as to provide improved air removal.

Figure 3:
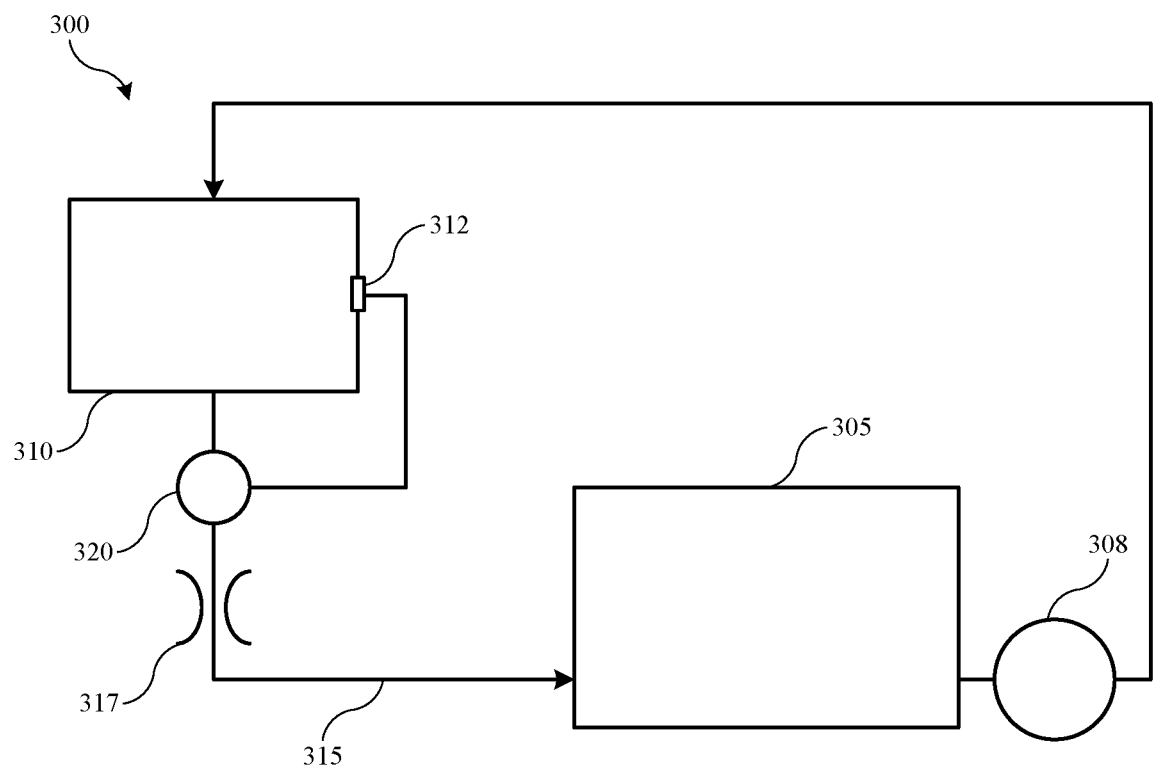
FIG. 3 shows a schematic view of fluid delivery system according to embodiments of the present technology.

FIG. 3 shows a schematic view of fluid delivery system 300 according to embodiments of the present technology. Fluid delivery system 300 may be a simplified view of a processing system for illustrational purposes, but it is not intended to limit the complexity of systems to which the present technology may be applied. Fluid delivery system 300 illustrates an active system for providing precise control over liquid level within a processing vessel during processing, and which may facilitate proactively limiting air entrainment within the processing fluid. Fluid system 300 may include any of the aspects of processing system 100 previously described, and may illustrate a fluid return and delivery system for providing processing fluid for performing the plating operations described above.

Fluid system 300 may include a recirculating tank 305. Recirculating tank 305 may include or house a first volume of processing fluid, which may be delivered to one or more plating apparatuses. The recirculating tank 305 may be coupled with a delivery pump 308, which may facilitate delivery of the processing fluid to the one or more vessels. In some embodiments, the recirculating tank may be positioned vertically below a level of a processing apparatus, and so delivery pump 308 may be configured to deliver processing fluid with a force sufficient to overcome any head pressure in the delivery piping or system. Fluid delivery system 300 may include a vessel 310 in which processing operations may occur, such as plating as previously described. Vessel 310 may be similar to vessel 210 as previously described, which may include an inner chamber and outer chamber as discussed with regard to FIG. 2.

Although fluid flow through system 300 is illustrated as entering vessel 310 at one end and exiting vessel 310 from another, it is to be understood that the diagram is for illustration purposes only, and is not intended to limit the technology. For example, processing fluid may be delivered up into vessel 310 from below to limit turbulence and surface bubble formation. Similarly, fluid may be removed from vessel 310 at any level, such as from a port in an outer chamber of vessel 310 as previously described. Delivery into and removal from vessel 310 may occur in any number of ways in the present technology. An inner chamber of vessel 310 may be sized to hold a volume of processing fluid for performing operations on a substrate. For example, an inner chamber of vessel 310 may be sized to hold a second volume of processing fluid less than the first volume of processing fluid held in recirculating tank 305. By including a greater volume of processing fluid in recirculating tank 305, the system may accommodate multiple vessels 310, as well as ensure adequate processing fluid availability during processing.

Vessel 310 may include a liquid level sensor 312 coupled with or associated with vessel 310. Liquid level sensor 312 may be an electronic sensor, a float sensor, or any other sensor that may provide feedback, such as electronic feedback that may be used to adjust flow from the vessel 310. The liquid level sensor 312 may be positioned with vessel 310 to provide a liquid level indication in an outer chamber of vessel 310. The liquid level sensor 312 may provide a variable feedback based on a fluid height or volume within the outer chamber of vessel 310. For example, liquid level sensor 312 may provide feedback in a range of values, such as voltage values, based on a sensed level within the outer chamber of vessel 310. In this way, algorithmic decisions may be performed that include rate of change consideration of volume or height changes within the vessel 310.

A return line 315 may be included in fluid delivery system 300, and may be positioned between an outlet of the vessel 310 and an inlet of recirculating tank 305. Return line 315 may be fluidly coupled with recirculating tank 305 and may provide fluid from vessel 310 back for recirculation. Although not illustrated, fluid delivery system 300 may include additional components including valves, flow sensors, temperature controllers such as heat exchangers, heaters, or chillers, delivery sources for ionic species to rebalance material compositions within the processing fluid, and any other useful components related to plating or processing systems.

Fluid delivery system 300 may also include a return pump 320. Return pump 320 may be positioned within the system in fluid communication between the vessel 310 and the recirculating tank 305. Return pump 320 may be fluidly coupled with the return line 315, and may directly feed the processing fluid into return line 315. Return pump 320 may be electronically coupled with liquid level sensor 312 in embodiments, and may be coupled with liquid level sensor 312 in a closed feedback loop. Unlike a valve included in return line 310, return pump 320 may be able to increase pressure or flow through return line 315. For example, a valve included in return line 315 when fully opened will accommodate a fluid flow based on the head pressure of the system and the size and characteristics of the return pipe. A return pump, however, may facilitate improved passage of fluid under a variety of circumstances, and may dictate the pressure and rate alone. Additionally, in a sensitive fluid system, a pump such as return pump 320 may better accommodate minute and continuous changes of flow rate than a variable valve.

For example, during steady state processing, maintaining appropriate fluid flow from vessel 310 may involve fluctuating flow up and down in minute amounts. A valve continuously switching between opening and closing may strain a diaphragm or other components of the valve. A pump such as return pump 320, however, may simply modulate the speed of delivery to perform the same accommodation, which may provide longer-lasting operation of the system components. Plating systems may be sized based on space available for the system, substrate dimensions, and other variables that may constrain the system as well as the system components. For example, a system setup may be limited in size and height, which may limit the amount of space available between a vessel and a recirculating tank. As many such systems involve a gravity-based return, reductions in height may further constrain the amount of head pressure available for fluid return.

For example, a height difference between the vessel 320 and the recirculating tank 305, or a height differential for the fluids contained within, may be less than or about 36 inches, and may be less than or about 30 inches, less than or about 24 inches, less than or about 18 inches, less than or about 15 inches, less than or about 12 inches, less than or about 10 inches, less than or about 9 inches, less than or about 8 inches, less than or about 7 inches, less than or about 6 inches, less than or about 5 inches, less than or about 4 inches, less than or about 3 inches, or less. Although components can be adjusted to counter these effects, these adjustments may increase the risk of reducing tolerance of the system to volumetric flux, which may affect control over air entrainment. Accordingly, tighter tolerance on fluid level may be provided with the present technology that may not be limited to gravitational fluid return.

Return pump 320 along with return line 315 may be sized in consideration of fluid flow into vessel 310. Delivery pump 308 may provide a relatively constant flow of processing fluid in embodiments, and return pump 320 and return line 315 may be sized to provide a fluid flow rate below a delivery flow rate when return pump 320 is disengaged. For example, such as in situations where a wafer is removed from vessel 310 and the volume in the outer chamber may begin to decrease, return pump 320 may be cycled off, or operated at a minimum speed. The liquid level sensor 312 may indicate or register a fluid level in the outer chamber as near, at, or below a predetermined minimum level. Accordingly, in response, return pump 320 may be configured to disengage. This operation may limit removal from the outer chamber until the liquid level sensor 312 determines the fluid level has increased sufficiently to engage the return pump again. Additionally, the return line 315 may be sized to accommodate increased fluid flow when the pump is fully engaged, such as when a substrate is delivered into the processing system and the volume of fluid delivered into the outer chamber may increase rapidly. Return pump 320 may be ramped accordingly to address the increased volume of fluid in the outer tank, and return line 315 may be sized to accommodate this increased volumetric flow.

Return line 315 may also include a restriction 317 within the line in some embodiments. Because return line 315 may be sized to accommodate increased fluid flow, such as during entry of a substrate into the vessel 310, the return line may also include restriction 317 to control fluid flow from the vessel even when return pump 320 is operating at a low speed, or has been disengaged. In embodiments, the restriction 317 may be sized to maintain a gravity-assisted fluid flow rate less than a steady-state delivery rate from the delivery pump 308.

The return pump 320 may be characterized by a number of features related to the particular system operation with which it is involved. For example, the return pump may include a control algorithm that may accommodate the variable signal that may be received from liquid level sensor 312, and determine a pump speed based on this input. Because liquid level sensor 312 may provide a variable signal of liquid level within the outer chamber, return pump 320 may include a control algorithm that includes a rate-based component. For example, in some embodiments, return pump 320 may include a control algorithm that includes proportional control, and may include one or more of an integral-level control component and/or a derivative-level control component of the algorithm.

In some embodiments, the return pump 320 may include components that are chemically compatible with the processing fluid of fluid delivery system 300. Plating and liquid processing systems such as fluid delivery system 300 may include a number of components including acids and bases that may corrode some metallic or other system components. Return pump 320 may be composed of or include components that will be in contact with processing fluid materials that can withstand the particular environment of fluid delivery system 300. For example, return pump 320 may include components that do not corrode or chemically degrade when contacted by one or more acids, bases, aqueous solutions, or other materials included within the processing fluid, such as metallic or ionic components. Exemplary materials to which the return pump may contact and to which the return pump components may not be susceptible to degradation may include basic materials, such as potassium hydroxide or other hydroxide-containing materials. Materials may include acids including one or more nonmetal elements including boron, carbon, nitrogen, phosphorous, sulfur, fluorine, or chlorine. For example, exemplary acids with which the return pump 320 or components of the return pump may be chemically compatible include boric acid, hydrochloric acid, sulfuric acid, alkanesulfonic acids, including methanesulfonic acid, alkanolsulfonic acids, among other acids.

Return pump 320 may be sized based on a system flow rate of less than, up to, or greater than about 0.5 gpm, greater than or about 1 gpm, greater than or about 1.5 gpm, greater than or about 2 gpm, greater than or about 2.5 gpm, greater than or about 3 gpm, or greater in embodiments. Accordingly, return pump 320 may include a motor sized to be less than or about 1 hp, less than or about 0.5 hp, less than or about 0.25 hp, less than or about 150 Watts, less than or about 100 Watts, less than or about 80 Watts, less than or about 50 Watts, less than or about 30 Watts, less than or about 10 Watts, or smaller. By providing a return pump 320 that may be sized to quickly adjust to volume differentials within the system, liquid level within the vessel may be tightly controlled to limit air entrainment within fluid delivery system 300. For example, the height of fluid within the outer chamber of vessel 310 may be controlled within a few millimeters of height at all times, whereas systems using larger pumps may be incapable of such fine tune adjustments.

Figure 4:
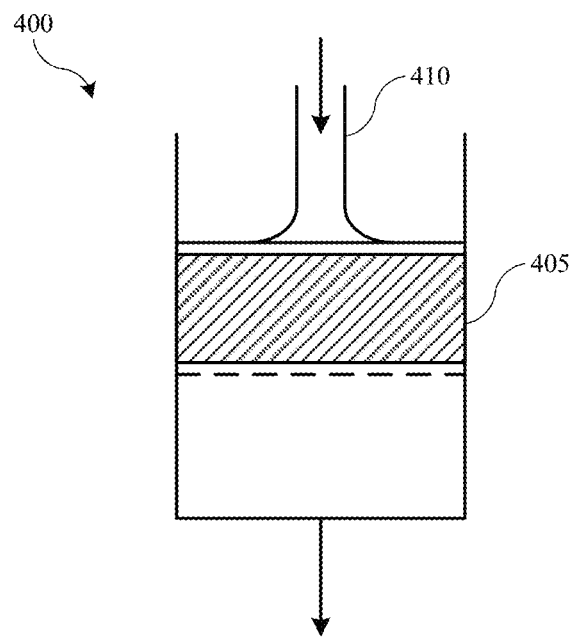
FIG. 4 shows a schematic cross-sectional view of an exemplary component of a processing system according to embodiments of the present technology.

In some systems, although control may be afforded over an amount of air entrained within the processing fluid, processing operations may still incorporate an amount of air within the processing fluid. FIG. 4 shows a schematic cross-sectional view of an exemplary container 400 of a processing system according to embodiments of the present technology. Container 400 may be used to reduce or remove bubbles or air within a processing fluid in embodiments. Container 400 may be incorporated within fluid delivery system 300, and may be fluidly coupled with the return line 315, for example, and may or may not be included with return pump 320 in embodiments.

Container 400 may be a passive component for removal of air from the processing system in embodiments. Container 400 may be configured to receive processing fluid exiting a vessel, such as vessel 310 previously described. Container 400 may include a media 405 configured to extract entrained air bubbles within the processing fluid. Container 400 may include a controlled delivery of processing fluid from the vessel 310, such as from a weir positioned proximate the exit port from the outer chamber of vessel 310, which may provide processing fluid to container 400 through standpipe 410 or some other channel for providing the processing fluid. In some embodiments, container 400 may be coupled with multiple vessels 310, and may be configured to receive processing fluid from multiple vessels in operation within a fluid delivery system.

As the processing fluid flows through media 405, bubbles contained within the processing fluid may contact the media 405 and be collected on one or more surfaces of the media. Media 405 may be a porous media having an ordered or random configuration of pores. As bubbles contact the media, they may initially be maintained on surfaces of the media from the downward flow of processing fluid from the vessel 310. The processing fluid may then continue through the container 400 into return line 315 with a reduced amount of air or bubbles. As more bubbles are collected on the media 405, the bubbles may begin to coalesce into larger bubbles. Larger bubbles may eventually be large enough to be characterized by a buoyant force capable of overcoming the downward fluid pressure. The bubbles may then rise to the surface and be removed from the system.

Depending on where the bubbles are contained within the media, as the bubbles rise against the media, they may be broken up as they traverse layers or pores of the media, however, the bubbles may then re-coalesce and continue through the media in this way. Accordingly, the container may be self-venting in that the air removed from the processing fluid may flow to a top of the container 400 and be naturally removed from the system. The container may also be characterized by a height such that the entry of fluid into the container 400 may not be of sufficient force to simply pull bubbles through the media and continue through the system. For example, the container or distance between the standpipe 410 and media 405 may be sufficient to ensure an entry force or flow of processing fluid does not fully permeate the media before the media removes bubbles from the processing fluid.

Media 405 may be any number of materials chemically compatible with the processing fluid. The materials may be chemically resistant to or compatible with any of the previously noted materials that may be in the processing fluid. The media 405 may be a polymeric material, and may be included in a number of forms within the container 400. For example, media 405 may be a series of porous plates having varied apertures and configurations. Additionally, media 405 may be a series of tightly packed tubes extending through container 400 and providing a controlled delivery that may allow removal of bubbles from the processing fluid. Media 405 may be a netting or mesh having an irregular shape within the container 400, and having a number of pores in a variety of shapes and sizes. The mesh may be contained or compressed within container 400, such as compressed between porous plates or structures within container 400.

The structure of media 405 may allow removal of bubbles from a flowed processing fluid characterized by a diameter of greater than or about 1 µm. In embodiments, the media 405 may be configured to extract bubbles characterized by a diameter of less than or about 1 µm, less than or about 0.8 µm, less than or about 0.6 µm, less than or about 0.4 µm, less than or about 0.2 µm, less than or about 0.1 µm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less. In this way, container 400 and media 405 may be capable of substantially, essentially, or completely removing air bubbles of a variety of sizes entrained within the processing fluid from a fluid delivery system.

Figure 5:
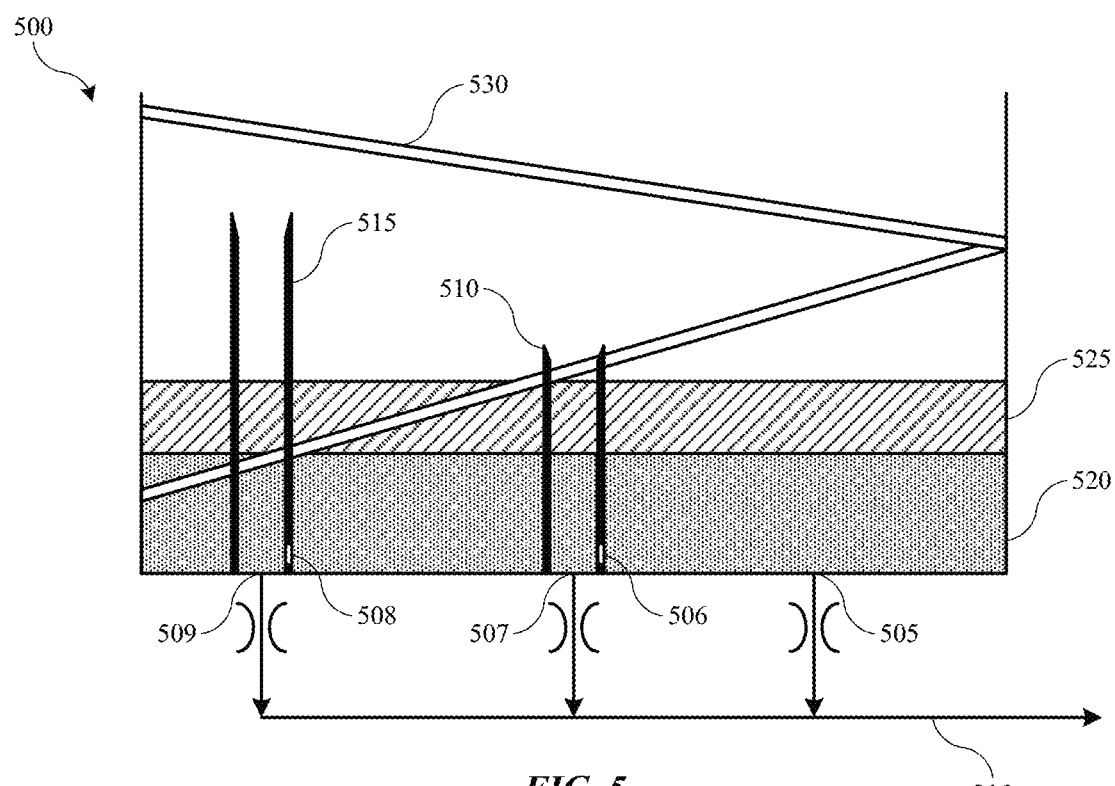
FIG. 5 shows a schematic cross-sectional view of an exemplary buffer vessel of a processing system according to embodiments of the present technology.

Additional passive removal components may be incorporated within a fluid delivery system as well. FIG. 5 shows a schematic cross-sectional view of an exemplary buffer vessel 500 of a processing system according to embodiments of the present technology. Buffer vessel 500 may be incorporated within fluid delivery system 300, and may be fluidly coupled with the return line 315, for example, and may or may not be included with return pump 320, or container 400 in embodiments. Such as with fluid delivery system 300, buffer vessel may be incorporated within the system and coupled between the processing vessel and the recirculating tank. The buffer vessel 500 may receive processing fluid from a processing vessel, such as vessel 310, and may receive processing fluid from a plurality of processing vessels. For example, buffer vessel 310 may be sized to accommodate a processing fluid volume between a first volume of recirculating tank 305 and a second volume corresponding to one or more processing vessels of a fluid delivery system.

Buffer vessel 500 may include one or more exit ports from the vessel, and may include a number of exit ports equivalent to or greater than a number of processing vessels delivering processing fluid to the buffer vessel 500. Buffer vessel 500 may include a first exit port 505 coupled with a return line 315, such as previously described, through the base of buffer vessel 500. Buffer vessel 500 may also include a standpipe 510 coupled with a base of the buffer vessel 500. Buffer vessel 500 may include a second exit port 507 that may be accessed through the standpipe 510. Second exit port 507 may provide an additional fluid access to the return line 315 as illustrated. One or both of the fluid accesses to return line 315 may include a restriction to further control fluid flow from buffer vessel 500 as previously discussed with relation to restriction 317 described above. Buffer vessel 500 is also shown to include a second standpipe 515 providing additional fluid access to the return line 315 through a third exit port 509. Buffer vessel 500 may include any number of standpipes and exit ports in embodiments that may be based on a number of processing vessels delivering processing fluid to buffer vessel 500.

In operation, buffer vessel 500 may be utilized to control flow and maintain a packed return of processing fluid from any number of processing vessels of a fluid delivery system. The buffer vessel may provide a self-regulating or passive flow control that may accommodate one or more processing vessels cycling on and off from the fluid delivery system. During operation of a single processing vessel, exit port 505, which in embodiments may or may not include a standpipe similar to standpipes 510, 515, may allow removal of processing fluid from the buffer vessel 500. The exit port may be sized so that a certain head within the buffer vessel may provide a matched flow rate of processing fluid delivered into a processing vessel, and may also maintain a liquid level 520 above a certain distance from exit port 505 to reduce or limit air entrainment into the return line 315.

As a substrate is entered into the processing vessel, the liquid level may rise or fluctuate up to a height 525, which may be below standpipe 510 in embodiments. The higher level may provide an increased flow rate from buffer vessel 500 as head pressure increases until the level is reduced back to a baseline 520. During substrate removal, although the fluid height may decrease slightly, which may further reduce flow from the vessel, the fluid height 520 may be predetermined via an amount of head to accommodate this loss without exposing exit port 505 until additional fluid is provided from an outlet of a processing vessel.

As an additional processing vessel cycles on, fluid level within the buffer vessel 500 may rise, and may extend above a height of a first standpipe 510. Standpipe 510 may include a weep hole 506 or other port proximate a base of the standpipe to maintain a minimal flow from exit port 507 to limit air entrainment from that exit port. Standpipe 515 may similarly include a weep hole 508. Once the fluid level rises above standpipe 510, the pipe fills, and exit port 507 may provide adequate fluid flow from the chamber to account for the increased head in the system, which may now be accommodated by both exit ports 505, 507. The standpipe

510 may be sized to extend above a height of fluctuation of a first vessel operating, but may be fully submerged when a second vessel is operated.

Standpipe 515 may be sized to accommodate the volume addition of a third processing vessel, and may be sized to extend above a height of fluctuation of the first vessel and second vessels operating, but may be fully submerged when a third vessel is operated. Although only two such standpipes are illustrated, any number of standpipes may be included to accommodate additional processing vessels in operation, such as greater than or about 2, greater than or about 3, greater than or about 4, greater than or about 5, greater than or about 6, greater than or about 7, greater than or about 8, greater than or about 9, greater than or about 10, greater than or about 11, greater than or about 12, greater than or about 13, greater than or about 14, greater than or about 15, or more. In embodiments a plurality of standpipes may be included equal to or less than, such as including one less standpipe, a number of processing vessels included in the fluid delivery system. Each standpipe may provide access to an exit port, and may extend from the base of the buffer vessel 500 to a height within the buffer vessel 500 different from each other standpipe to accommodate each processing vessel during operation.

The standpipes may be characterized by features to reduce or limit air entrainment into the processing fluid. For example, the standpipes may be sized so that small bubbles that do flow within the standpipe may be characterized by sufficient buoyant force to rise to the surface without being pulled within the return line 315. For example, bubbles within any of the ranges previously described may rise within the standpipes and be removed from the buffer vessel. In some embodiments, the standpipe may be characterized by one or more sloping surfaces at an inlet about a top of the standpipe. For example, standpipe 510 may include a sloped, chamfered, or beveled interior edge at a top of the standpipe. The standpipe may also have ports or a weir about the top of the standpipe to control flow of fluid into the standpipe to limit turbulence and bubbles as processing fluid flows within the standpipe.

Buffer vessel 500 may also include one or more delivery devices for providing processing fluid within the buffer vessel 500. Depending on the height of delivery into the buffer vessel, unimpeded or uncontrolled flow into the buffer vessel may produce a hydraulic jump on delivery, which may increase air entrainment within the processing fluid. Accordingly, in some embodiments, the buffer vessel may include a delivery pipe or channel, such as channel 530 for delivering processing fluid into buffer chamber 500 in a controlled manner. Depending on the size of the buffer vessel, channel 530 may include a spiral or sloped design, or may include a down tube configured to provide processing fluid within buffer vessel 500.

A media may be incorporated within the buffer vessel 500 to further reduce bubbles within the processing fluid. Container 400 previously described may be incorporated within return line 315, although return line 315 may be characterized by a packed fluid flow from buffer vessel 500. In some embodiments, a media as previously described may be positioned or contained within one or more of the standpipes or within the accesses from exit ports to the return line 315. The media may be configured as previously discussed to extract entrained bubbles within the processing fluid. By providing one or more passive or active solutions as described in the present disclosure, air entrainment within processing systems may be reduced, controlled, or eliminated. Such systems and components may afford improved substrate processing and further limit defects during plating and other semiconductor processing operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating processing system comprising:
a recirculating tank containing a first volume of processing fluid;
a vessel configured to receive the processing fluid from the recirculating tank, wherein the vessel comprises an inner chamber and an outer chamber, wherein the inner chamber is sized to hold a second volume of processing fluid less than the first volume of processing fluid, and wherein a liquid level sensor is associated with the vessel to provide a liquid level indication in the outer chamber;
a delivery pump fluidly coupled with the recirculating tank and positioned between the recirculating tank and the vessel;
a return line positioned between an outlet of the vessel and an inlet of the recirculating tank, wherein a portion of the return line forms a restriction sized to maintain a gravity-assisted fluid flow rate less than a steady-state delivery rate of the delivery pump, and wherein the return line does not include a valve; and a return pump fluidly coupled with the return line at a position between the outlet of the vessel and the inlet of the recirculating tank, wherein the return pump is electrically coupled with the liquid level sensor.

2. The electroplating processing system of claim 1, wherein the return pump is configured to disengage when the liquid level sensor indicates a fluid level in the outer chamber of the vessel at or below a predetermined minimum.

3. The electroplating processing system of claim 1, wherein the return pump comprises an integral-level control algorithm to determine pump speed based on readings from the liquid level sensor.

4. The electroplating processing system of claim 1, wherein the return pump is chemically compatible with at least one of methanesulfonic acid, potassium hydroxide, and boric acid.

5. The electroplating processing system of claim 1, wherein the return pump is rated at less than or about 100 Watts.

6. The electroplating processing system of claim 1, wherein the vessel is positioned within the system at a fluid height differential from the recirculating tank of less than 24 inches.

7. The electroplating processing system of claim 1, wherein the liquid level sensor is a first liquid level sensor disposed at a first height on the vessel; and wherein the electroplating processing system further comprises:

a second liquid level sensor disposed at a second height on the vessel.

8. The electroplating processing system of claim 1, wherein the restriction is formed on the return line between the return pump and the recirculating tank.

9. The electroplating processing system of claim 1, further comprising:

a container fluidly coupled with the return line between the vessel and the return pump, wherein the container is configured to receive processing fluid exiting the vessel, and wherein the container comprises a media configured to extract entrained bubbles within the processing fluid.

10. The electroplating processing system of claim 9, wherein the media comprises a polymeric material.

11. The electroplating processing system of claim 10, wherein the polymeric material comprises a mesh disposed within the container.

12. The electroplating processing system of claim 1, further comprising:

a buffer vessel fluidly coupled between the vessel and the recirculating tank, wherein the buffer vessel comprises a first exit port from the buffer vessel, wherein the buffer vessel comprises a standpipe coupled with a base of the buffer vessel, and wherein the standpipe is characterized by a sloped surface of an interior edge at a top of the standpipe.

13. The electroplating processing system of claim 12, wherein the buffer vessel comprises a channel positioned within the buffer vessel and configured to deliver processing fluid down into the buffer vessel.

14. The electroplating processing system of claim 12, wherein the standpipe is characterized by a port proximate the base of the buffer vessel, and wherein the standpipe provides access to a second exit port from the buffer vessel.

* * * * *